United States Patent [19]

Landis

[11] 4,091,323
[45] May 23, 1978

[54] AUTOMATED SAMPLE CHANGER FOR NUCLEAR MAGNETIC RESONANCE SPECTROMETER

[75] Inventor: Paul W. Landis, Indianapolis, Ind.

[73] Assignee: Eli Lilly and Company, Indianapolis, Ind.

[21] Appl. No.: 730,035

[22] Filed: Oct. 6, 1976

[51] Int. Cl.² ............................................ G01R 33/08
[52] U.S. Cl. ............................. 324/.5 AH; 23/253 R; 356/244
[58] Field of Search ................ 356/244, 246; 23/253, 23/259; 73/421 R, 421 B; 324/.5 R, .5 A, .5 AH

[56] References Cited

U.S. PATENT DOCUMENTS

| 3,394,300 | 7/1968 | Packard et al. | 324/.5 R |
| 3,900,289 | 8/1975 | Liston | 23/253 R |
| 3,918,913 | 11/1975 | Stevenson et al. | 23/253 R |

*Primary Examiner*—Rudolph V. Rolinec
*Assistant Examiner*—Michael J. Tokar
*Attorney, Agent, or Firm*—Ralph W. Ernsberger; Everet F. Smith

[57] ABSTRACT

An automated sample changer, controlled by gas fluidic circuitry, integrated with a Nuclear Magnetic Resonance (NMR) spectrometer provides a means for sequentially transferring samples to and from such spectrometer without an attendant to control such transfer. Such a changer comprises a means for holding a series of samples, a robot arm cooperating with such holding means and disposed in alignment with the sample receiving tube of an NMR spectrometer, a gas fluidic circuit to sense the required action, and a second gas fluidic circuit integrated therewith to provide the energy to make the transfer.

6 Claims, 6 Drawing Figures

AUTOMATED SAMPLE CHANGER FOR NUCLEAR MAGNETIC RESONANCE SPECTROMETER

BACKGROUND OF THE INVENTION

1. Field of the Invention

The useful apparatus of the instant invention is concerned with an automated delivery system. More particularly it is concerned with the use of gas fluidic circuitry in combination with appropriate mechanical devices to sequentially transfer samples from a sample holding means to an NMR spectrometer and back to such means after the NMR analysis is complete.

2. Prior Art

Automated delivery systems are old in the art. Devices and apparatus for transferring samples from a sample holding means to an instrument for an analysis of such samples are also old in the art. Mechanical, electrical, electronic, and liquid hydraulic means, and combinations thereof, have been adapted to systems for transferring samples, and containers thereof, to and from instruments which analyze various characteristics of such samples.

NMR spectrometry is a means for determining various molecular substituents present in a sample by using magnetic fields and radio frequency (RF) radiation to examine the molecular structure of constituents present in standard solutions. The sample to be analyzed is introduced into the spectrometer in a solution disposed in a specially designed container which can be rotated (spun) in an RF field, and by observing the frequencies at which the RF is absorbed, certain characteristics of the molecular structure can be determined.

Inasmuch as the NMR analytical technique involves a magnetic field it is imperative that no stray electromagnetic forces are generated in the field in which the sample is disposed. Consequently, electrical and electronic means for operating an automated sample transfer system with an NMR spectrometer are not favored because of the need to shield the system to prevent stray magnetic radiation. Pure mechanical systems are bulky, cumbersome and slow. Liquid hydraulic systems are also bulky and limited in their applications where liquids do not present a contamination problem as are combinations of liquid hydraulic and mechanical systems.

Accordingly, it is an object of this invention to provide an automated apparatus that is totally free of all extraneous magnetic fields for sequentially transferring samples to and from an NMR spectrometer.

It is another object of the instant invention to combine gas fluidic circuitry with appropriate mechanical devices to provide a reliable automated apparatus that is compact, self-sensing and responsive to integrated fluidic circuitry that utilizes low pressure gas to propel the mechanical parts of the apparatus as well as to sense the sequence of the operation of such mechanical parts for sequentially transferring samples to and from an NMR spectrometer.

SUMMARY

It has now been discovered that a sample holding means having an integrated indexing means and a cooperating means for transferring a sample from such holding means to an NMR spectrometer and back again can be activated, controlled and operated by fluidic circuitry wherein pilot valves are utilized to sense an increase in the back pressure of a gas and control subsequent operations of the mechanical parts of the apparatus.

DESCRIPTION OF THE PREFERRED EMBODIMENTS

In the following description of the embodiments of this invention reference is made to the accompanying drawings.

Figure 6:
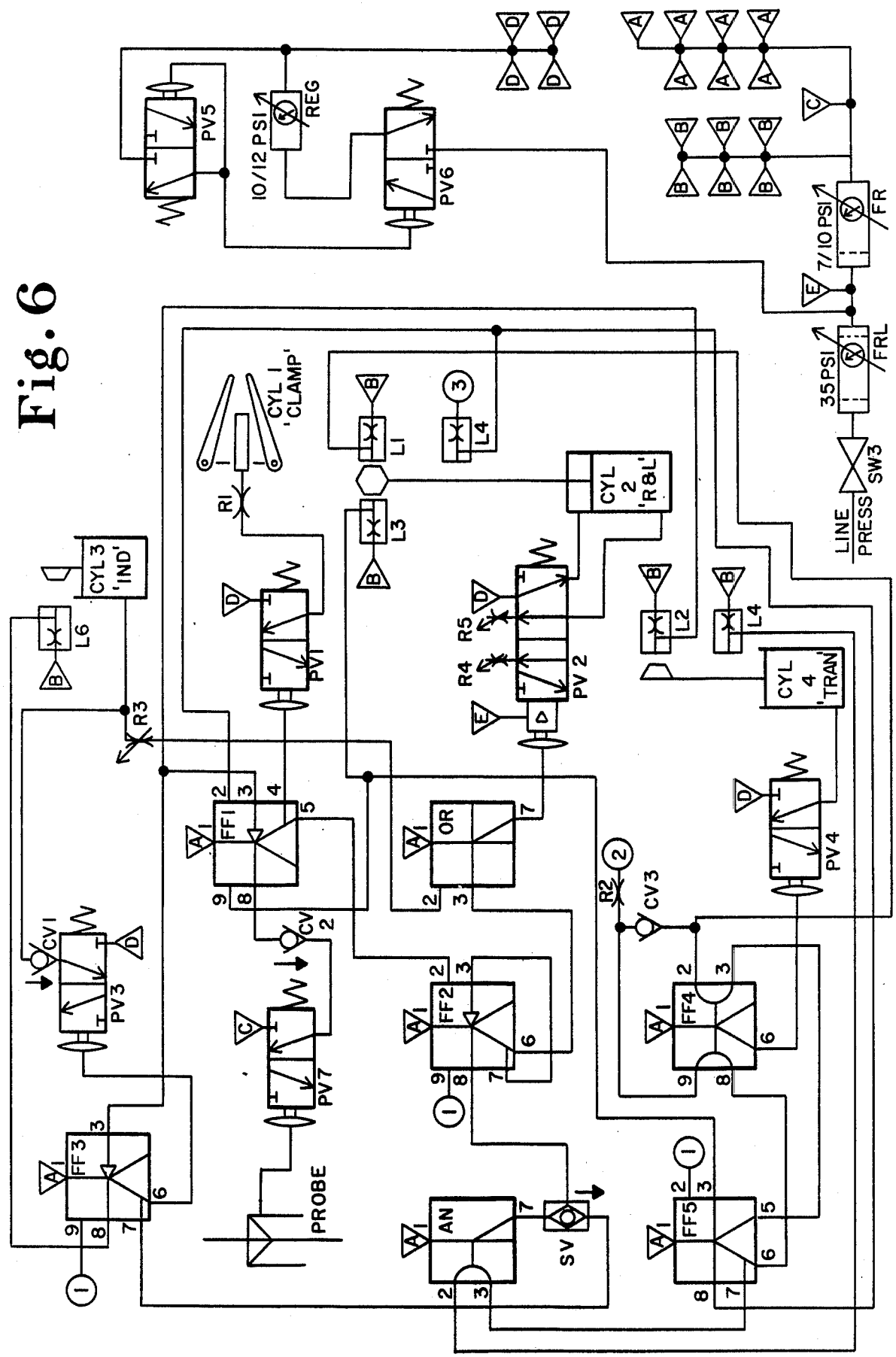
FIG. 6 is a schematic diagram of the gas fluidic circuitry showing the integration of the sensing and propelling circuits in the automated sample changer.

The automated sample changer for use with a Nuclear Magnetic Resonance (NMR) spectrometer 1 is comprised of, in combination: a) a sample holding element 10 having receptacles 11 for disposing samples for NMR analysis and having indexing means 41 associated and cooperating with said receptacles 11; b) means 54 powered by a first gas cylinder 50 cooperating with said indexing means 41 for advancing said holding element 10; c) a positive stop 58 cooperating with said indexing means 41 to limit the advance of said holding element to one receptacle at a time; d) a robot arm 4 having sample grasping means 6 and 6a integrated therewith, said arm 4 being disposed in a cooperating relationship with said sample holding element 10 which allows said arm 4 to travel in an arc which positions said grasping means 6 and 6a over a receptacle 11 in said holding element 10 at one end of said arc and over the sample receiving tube 3 of the NMR spectrometer 1 at the other end of said arc; e) a second gas cylinder 31 connected to said sample grasping means 6 and 6a to operate said grasping means, a third gas cylinder 23 connected to said robot arm 4 to move said arm 4 back and forth in said arc, and a fourth gas cylinder 20 connected to said robot arm 4 to move said arm up and down in a vertical plane; and f) gas fluidic circuitry, FIG. 6, connecting each of said four gas cylinders, 20, 23, 31 and 50 into a network responsive to programed logic actuated by pressurization of a signaling device at a pre-set stop on said gas cylinders.

The preferred sample holding element 10 is a turntable having receptacles 11 for placing samples therein, the receptacles 11 being positioned around the periphery of the turntable equidistant from each other.

The indexing means 41 preferred for use with a turntable comprises a circular row of downwardly disposed dowel-like pins 41 extending downwardly from the undersurface of said turntable 10, one of said pins 41 being disposed inwardly from each of said receptacles 11, said pins being equidistant from each other.

The preferred means for advancing said turntable 10 one receptacle at a time is comprised of a cam 54, a pawl 56 pivoted on said cam 54 to engage successively said pins 41 and a spring-loaded air cylinder 50 connected to said cam 54 at pivot 53 through rod 52, and whereon there is pre-positioned a stop 58 to engage one of pins 41 and regulate the travel of turntable 10.

The preferred sample grasping means 6 and 6a is a pair of scissors jaws spring 30 loaded to hold said jaws 6 and 6a open, said jaws 6 and 6a having disposed between the extensions thereof a gas cylinder 31 which when actuated closes said jaws 6 and 6a.

The novel combination of elements for the automated sample changer for a Nuclear Magnetic Resonance (NMR) spectrometer which are embodied in the instant invention are constructed and operated as illustrated and described hereinafter.

Figure 1:
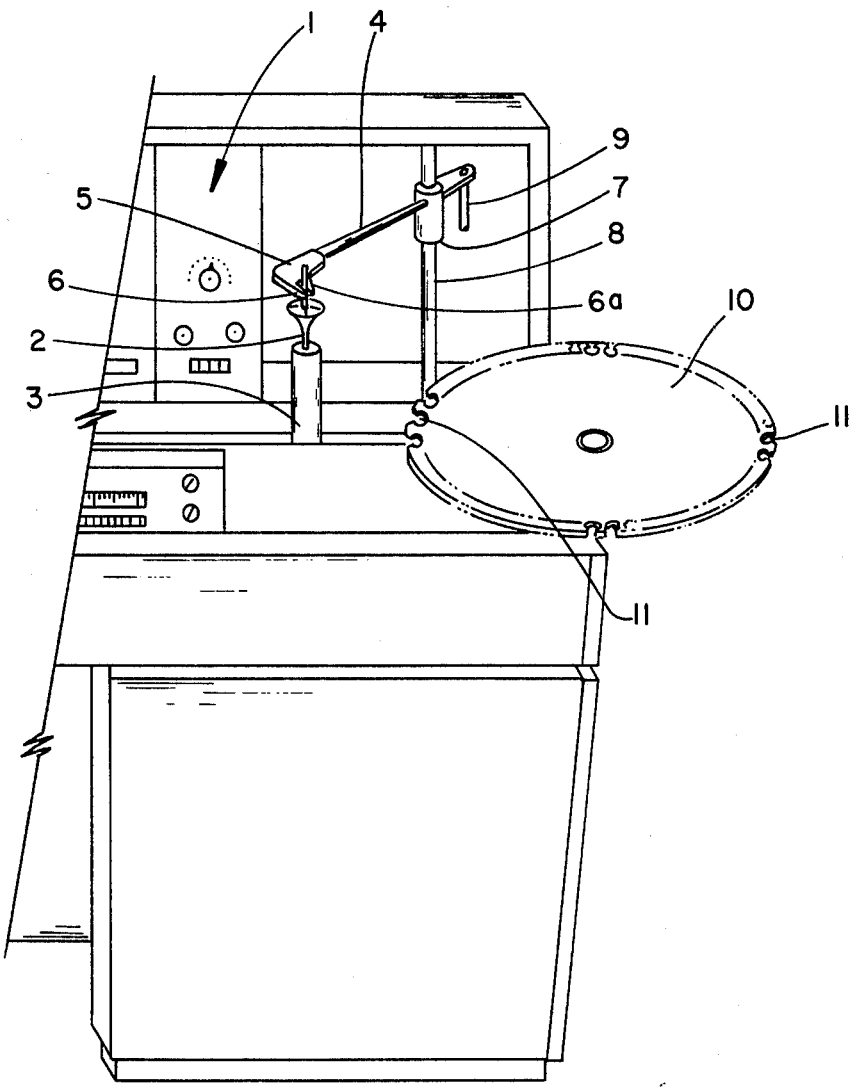
FIG. 1 is a perspective rendering of the sample holding means, robot arm and sample grasping means of the automated sample changer adapted to an NMR spectrometer.

In FIG. 1 an NMR spectrometer 1 is shown with the sample transfer elements in place. In this rendering the turntable 10 is the sample holding means and the receptacles 11 are shown at the periphery of said turntable 10. In actuality there are receptacles 11 all around the periphery and equidistant from each other. A robot arm 4 is connected to a slidable bushing 7. The slidable bushing 7 is disposed on a fixed bar 8, said bar 8 being positioned to allow the robot arm 4 to swing in an arc so that the sample grasping means 6 and 6a are positioned over a receptacle 11 in turntable 10 at one end of said arc and over the sample introduction tube 3 of the NMR spectrometer at the other end of the arc. A typical sample 2 is shown grasped by the sample grasping means 6 and 6a and disposed above said sample introduction tube 3. The head 5 of robot arm 4 contains the elements of the sample grasping means and is detailed in FIG. 3.

A cut-away rod 9 is shown attached to bushing 7. The rod 9 is the connection with the gas cylinders which move the robot arm 4 in the aforementioned arc and up and down in a vertical plane.

Figure 2:
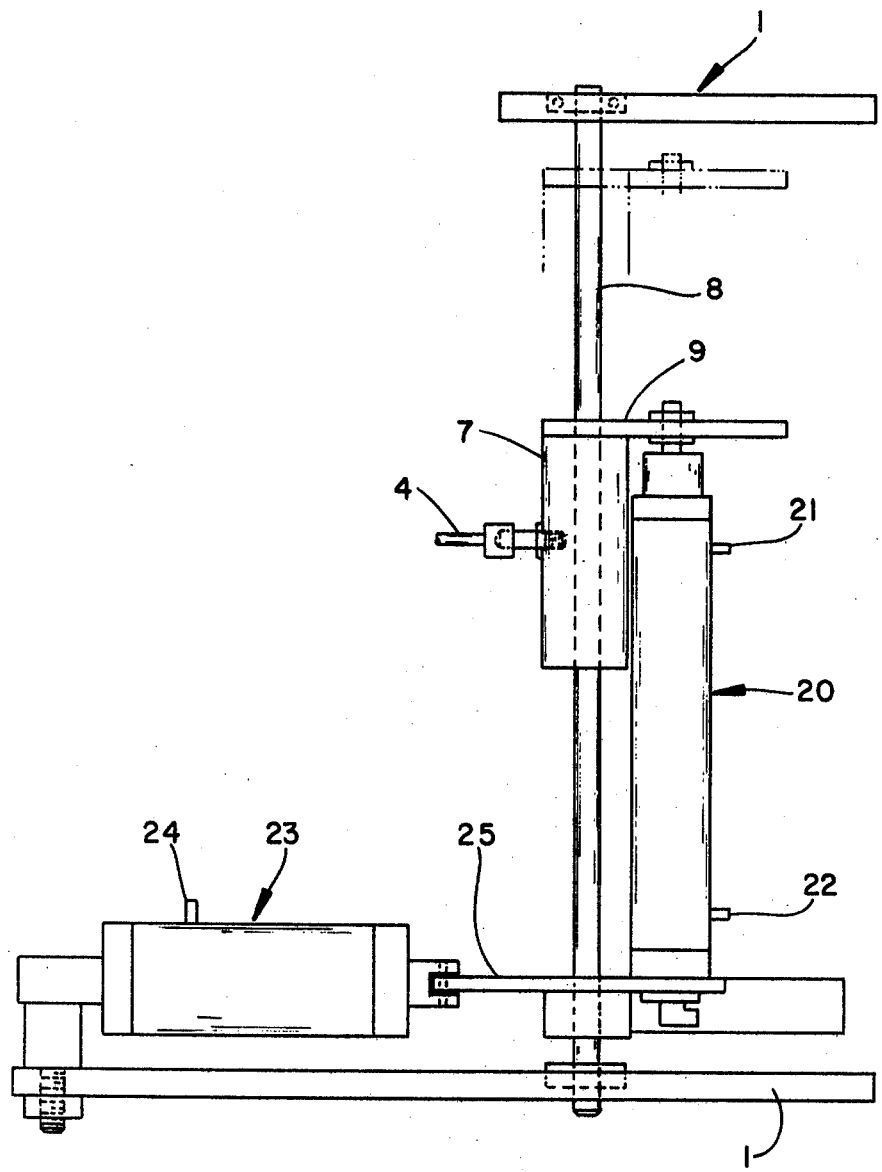
FIG. 2 is a side view of the third and fourth gas cylinders connected to the robot arm of the automated sample changer.

FIG. 2 shows the connection between rod 9 and gas cylinder 20. Gas cylinder 20 moves bushing 7, to which is attached robot arm 4, up and down on support rod 8 in a vertical plane. Gas connections 21 and 22 on gas cylinder 20 are inlets for gas to drive such cylinder 20 up and down. Gas cylinder 20 is pivotably connected to support rod 8 and turns with bushing 7 when gas cylinder 23 is actuated to move the robot arm 4 in the aforementioned arc. Gas inlet 24 in gas cylinder 23 provides compressed gas to extend the piston in said cylinder outwardly turning the assembly comprised of bushing 7, robot arm 4, connecting rod 9 and gas cylinder 20 in an arc around support rod 8. A spring loading in gas cylinder 23 retracts the piston in said cylinder to its closed position when the gas pressure is released from gas inlet 24.

Figure 3:
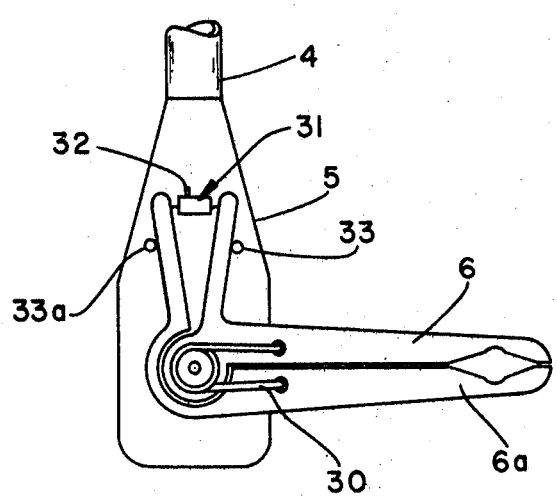
FIG. 3 is a bottom plan view of the sample grasping means of the automated sample changer.

FIG. 3 shows in detail the working elements which control the sample grasping means 6 and 6a. The scissors jaws of the sample grasping means 6 and 6a have cooperating recesses near the outward end thereof. It is within these recesses that the sample is grasped. In any installation the recesses are designed to accomodate the sample container and grasp the sample securely before the jaws come all the way together. Mechanical stops 33 and 33a keep the jaws 6 and 6a in alignment. The scissors jaws 6 and 6a are pivoted on the head 5 of robot arm 4. The spring 30 holds the jaws open when there is no pressure on gas cylinder 31. On signal, compressed gas is introduced into gas cylinder 31 through gas inlet 32. When there is no sample to be grasped by jaws 6 and 6a, gas cylinder 31 forces the extensions of such jaws against mechanical stops 33 and 33a.

Figure 4:
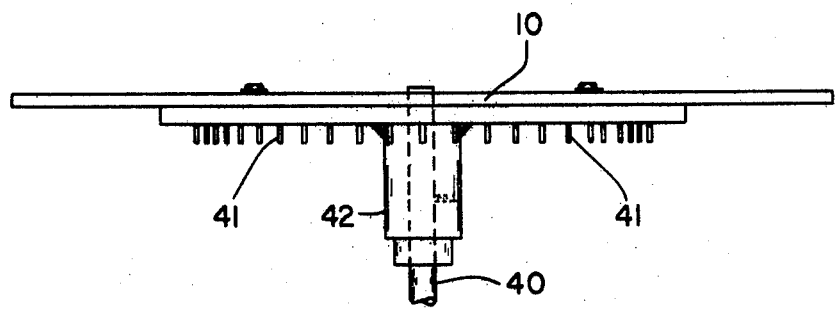
FIG. 4 is a side view of the sample holding means showing the indexing means associated with a rotatable turntable of the automated sample changer.

FIG. 4 shows turntable 10 with the dowel-like pins 41 extending downwardly from the undersurface of said turntable 10 and inboard from the periphery thereof. The support rod 40 for turntable 10 is fixedly mounted on the NMR spectrometer 1. Bushing 42 is attached to turntable 10 and rotates freely on support rod 40.

Figure 5:
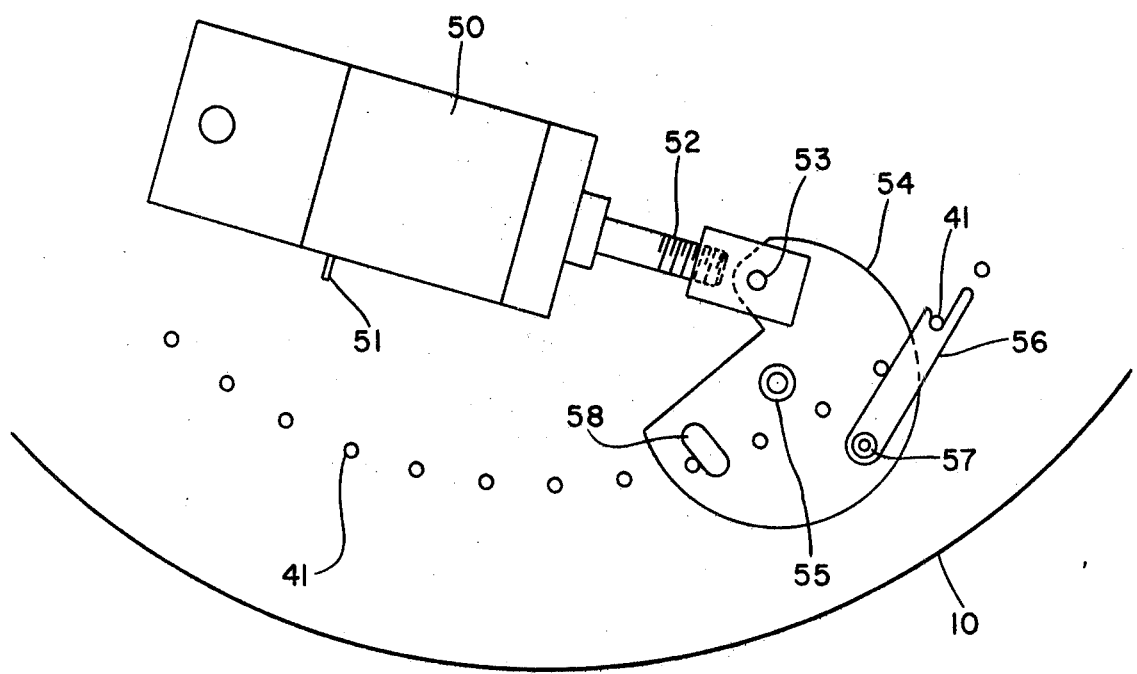
FIG. 5 is a bottom plan view of the turntable advancing means of the automated sample changer.

FIG. 5 shows the elements of the device which advances the turntable 10 one receptacle 11 at a time. The device is comprised of a spring loaded gas cylinder 50. A gas inlet 51 introduces compressed gas into said cylinder 50 to extend the piston 52 outwardly. Piston 52 is pivotably connected at 53 to cam 54. On cam 54 there is pivotably connected at 57 a pawl 56. Said pawl successively engages pins 41 to advance turntable 10 one receptacle 11 at a time when the pressure on gas cylinder 50 is released and the spring therein retracts piston 52. Cam 54 is pivoted at 55. Stop 58 is affixed to cam 54 and serves to limit the advance of turntable 10 by engaging successively advancing pins 41.

FIG. 6 is a schematic diagram of the fluidic circuitry which operates the apparatus detailed in FIGS. 1–5. A single source of compressed gas is utilized and is reduced to about 30–35 psig to feed the various segments of the circuitry. One segment, shown as E, is held at 30–35 psig and is fed into the controls of gas cylinder 20. The gas pressure is reduced to 10–12 for working gas cylinders 20, 23, 31 and 50. These are shown as D. The gas which is fed to the signaling devices B and C and the gates and flip flop valves A is reduced to 7–10 psig. This circuitry is shown on the right hand side of FIG. 6.

When the gas supply to the gas cylinders 20, 23, 31 and 50 is turned on through PV5 and PV6 after the logic has been initiated, the presence of an exhausted sample at the point identified as probe in the upper left corner of FIG. 6 activates the fludic circuitry automatically sequencing the operations of the various elements of the sample change of this invention, and, as long as there is a sample available is a receptacle 11 in turntable 10, will continue to pick up samples from such turntable 10, feed them into the sample introduction tube 3, remove them from such tube 3 and return them to the receptacle from which they were removed in turntable 10. When no sample is available in turntable 10, the automated sample changer sequence will continue to the point where the sample grasping means 6 and 6a is disposed above the sample introduction tube 3. The gas pressure will be released on gas cylinder 31, the jaws 6 and 6a will open and no further sequence will follow for lack of a signal to pick-up an exhausted sample from sample introduction tube 3.

The operation of the automatic sample changer, after the fluidic circuit is supplied with gas at the appropriate psig., is initiated by the development of back pressure in the gas stream floating an exhausted sample 2 near the top of sample introduction tube 3. Such back pressure is sensed by a pilot valve which signals the valve controlling the flow of gas to gas cylinder 31 to open and introduce compressed gas into said cylinder 31 closing said sample grasping means 6 and 6a on the exhausted sample 2.

Simultaneously the signal from the back pressure sensing pilot valve is conveyed to the valve controlling the upward thrust of gas cylinder 20 causing such control valve to open and let compressed gas flow into gas cylinder 20. Robot arm 4 is thus moved upwardly until a pre-set stop on gas cylinder 20 is contacted.

A signaling device is pressurized at such pre-set stop signaling the gas valve controlling the flow of gas into gas cylinder 23 to open and introduce compressed gas into gas cylinder 23 moving robot arm 4 in an arc to a position over an empty receptacle in turntable 10 and there contacting a pre-set stop.

A signaling device is pressurized at such a pre-set stop signaling the valve controlling the pressure in gas cylinder 31 to release such pressure allowing the spring-loaded jaws 6 and 6a to open and drop the exhausted sample 2 into the open receptacle 11 in turntable 10.

The release of the gas pressure from gas cylinder 31 pressurizes a signaling device to open the valve controlling the flow of compressed gas to gas cylinder 50 which rotates cam 54 to position pawl 56 in contact with the next following indexing pin 41. The thrust of gas cylinder 50 contacts a pre-set stop arresting such thrust. A signaling device is pressurized at such pre-set stop which signals the valve controlling the gas pressure in gas cylinder 50 to release such gas pressure whereupon cam 54 is returned to its original position by the spring-loaded gas cylinder 50, pawl 56 advancing turntable 10 one receptacle counter clockwise. Pre-set stop 58 is contacted by a following indexing pin 41 and stops the advance of turntable 10 at the appropriate location.

A signaling device at such pre-set stop is pressurized and signals the valve controlling the downward movement of gas cylinder 20 to open and admit compressed gas into such cylinder 20 and move robot arm 4 downward to contact a pre-set stop.

At such pre-set stop a signaling device is pressurized and signals gas cylinder 31 control valve to open and admit compressed gas into such cylinder 31 whereupon sample grasping means 6 and 6a close and grasp a new sample from a receptacle 11 in turntable 11.

Upon the closing of sample grasping means 6 and 6a a signaling device is pressurized and a signal sent to the valve controlling the introduction of compressed gas into gas cylinder 20 to open and admit compressed gas into such cylinder 20 to accomplish an upward movement of robot arm 4 until such robot arm 4 contacts a pre-set stop.

A signaling device is pressurized at such pre-set stop and a signal is sent to the valve controlling the gas pressure in gas cylinder 23 to release such pressure and permit the spring in gas cylinder 23 to take over and return such gas cylinder 23 to a pre-set stop at its original position said sample grasping means 6 and 6a, holding the new sample above sample introduction tube 3.

A signaling device at such pre-set stop is pressurized signaling the valve controlling the gas pressure in gas cylinder 31 to release the pressure in such cylinder 31 allowing the spring 30 to open the sample grasping means 6 and 6a and drop the new sample into the sample introduction tube 3 of the NMR spectrometer 1.

While any non-flammable gas is suitable for use in the fluidic network of the useful apparatus of the instant invention, compressed air is the preferred gas for economic reasons.

What is claimed is:

1. An automated apparatus for sequentially transferring samples to and from a Nuclear Magnetic Resonance (NMR) spectrometer which comprises:
   a. a sample holding element having receptacles therein for disposing samples for NMR analysis and having indexing means associated and cooperating with said receptacles;
   b. means powered by a first gas cylinder cooperating with said indexing means for advancing said holding element;
   c. a positive stop cooperating with said indexing means to limit the advance of said holding element to one receptacle at a time;
   d. a robot arm having a sample grasping means integral therewith, said arm being disposed in a cooperating relationship with said sample holding element which allows said arm to travel in an arc which positions said grasping means over a receptacle in said holding element at one end of said arc and over the sample receiving tube of said NMR spectrometer at the other end of said arc;
   e. a second gas cylinder connected to said sample grasping means to operate said grasping means, a third gas cylinder connected to said robot arm to move said arm back and forth in said arc, and a fourth gas cylinder connected to said robot arm to move said arm up and down in a vertical plane; and
   f. gas fluidic circuitry connecting each of said four gas cylinders into a network responsive to pressure exerted by said gas cylinders when each is extended to contact a pre-set stop.

2. The apparatus of claim 1 wherein said sample holding element is a turntable having receptacles for disposing samples therein located equidistant around the periphery thereof.

3. The apparatus of claim 1 wherein the indexing means comprises dowel pins extending downwardly from the undersurface of said turntable, said pins being disposed inwardly from each of said receptacle, each of said pins being equidistant from each other in a circle.

4. The apparatus of claim 1 wherein the means for advancing the turntable comprising the sample holding element is an air cylinder connected to a cam whereon there are disposed a pawl for engaging said indexing means, a spring for advancing said pawl and a stop for engaging the next in succession indexing means.

5. The apparatus of claim 1 wherein the sample grasping means is comprised of a pair of scissors jaws held open by a spring and closed by a gas cylinder.

6. The method of operating the apparatus of claim 1 which comprises:
   a. positioning an analyzed sample at the top of said sample receiving tube of said NMR spectrometer;
   b. signaling the presence of said analyzed sample at the top of said sample receiving tube to said second gas cylinder causing said second gas cylinder to close said sample grasping means, and simultaneously signaling the presence of said analyzed sample at the top of said sample receiving tube to said fourth gas cylinder causing said fourth gas cylinder to move said robot arm upwardly to a pre-set stop;
   c. pressurizing a signaling device at such pre-set stop resulting in a signal to said third gas cylinder to move said robot arm in an arc to a pre-set stop which positions said analyzed sample above an empty receptacle in said sample holding element;
   d. pressurizing a signaling device at such pre-set stop resulting in a signal to said second gas cylinder to release the pressure therein allowing the sample grasping means to release said analyzed sample into said sample holding element;

e. pressurizing a signaling device by the release of said pressure on said second gas cylinder resulting in a signal to said first gas cylinder to advance said sample holding element to the next in succession receptacle;

f. pressurizing a signaling device on said sample holding element advancing means resulting in a signal to said fourth gas cylinder to move said robot arm downwardly to a pre-set stop;

g. pressuring a signaling device at said pre-set stop resulting in a signal to said second gas cylinder to close said sample grasping means on a new sample from said sample holding element;

h. pressuring a signaling device on said sample grasping means resulting in a signal to said fourth gas cylinder to move said robot arm upwardly to a pre-set stop;

i. pressurizing a signaling device at such pre-set stop resulting in a signal to said third gas cylinder to move said robot arm in an arc to a pre-set stop wherein the said new sample is disposed above said sample receiving tube in said NMR spectrometer;

j. pressurizing a signaling device at such pre-set stop resulting in a signal to said second gas cylinder to release the pressure holding said sample grasping means closed dropping said new sample into said sample receiving tube of said NMR spectrometer completing the sample change cycle.

* * * * *